(12) United States Patent
Watanabe et al.

(10) Patent No.: US 10,390,470 B2
(45) Date of Patent: Aug. 20, 2019

(54) COMPONENT SUPPLY DEVICE, COMPONENT MOUNTER, AND COMPONENT-MOUNTED BOARD MANUFACTURING METHOD

(71) Applicant: Panasonic Intellectual Property Management Co., Ltd., Osaka (JP)

(72) Inventors: Hideaki Watanabe, Fukuoka (JP); Dai Yokoyama, Yamanashi (JP); Yosuke Nagasawa, Yamanashi (JP); Shigeki Imafuku, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 192 days.

(21) Appl. No.: 15/714,022

(22) Filed: Sep. 25, 2017

(65) Prior Publication Data

US 2018/0103566 A1     Apr. 12, 2018

(30) Foreign Application Priority Data

Oct. 11, 2016 (JP) ................ 2016-199631

(51) Int. Cl.
  *B23P 19/00*   (2006.01)
  *H05K 13/04*   (2006.01)
  *H05K 13/02*   (2006.01)
  *B65G 47/14*   (2006.01)
  *H05K 13/08*   (2006.01)
  (Continued)

(52) U.S. Cl.
  CPC ..... *H05K 13/0404* (2013.01); *B65G 47/1485* (2013.01); *F16F 15/022* (2013.01); *H05K 1/186* (2013.01); *H05K 13/02* (2013.01); *H05K 13/0421* (2013.01); *H05K 13/08* (2013.01)

(58) Field of Classification Search
  CPC ........... H05K 13/0421; H05K 13/0404; H05K 13/02; H05K 13/08; H05K 1/186; F16F 15/022; B65G 47/1485
  See application file for complete search history.

(56) References Cited

U.S. PATENT DOCUMENTS 4,810,018 A * 3/1989 van de Ven .......... B25J 15/0253
                                                    294/198
9,867,320 B2 * 1/2018 Watanabe .......... H05K 13/0404
(Continued)

FOREIGN PATENT DOCUMENTS

JP    2013-162103 A    8/2013
JP    5864294B B2      2/2016

*Primary Examiner* — Paul D Kim
(74) *Attorney, Agent, or Firm* — Pearne & Gordon LLP

(57) ABSTRACT

A component supply device includes a posture maintainer and a pair of cutting members. The posture maintainer includes a pair of grip members, each of which includes a tip end portion that extends in a traveling direction of a component holding tape. The posture maintainer maintains the posture of a component by gripping a body portion of the component having been supplied to a component supply position with the body portion interposed between the tip end portions of the pair of the grip members. The pair of cutting members cuts a lead portion of the component having been gripped by the pair of grip members with the lead portion interposed between the pair of cutting members in a direction intersecting a traveling direction of the component holding tape.

12 Claims, 14 Drawing Sheets

(51) Int. Cl.
*H05K 1/18* (2006.01)
*F16F 15/02* (2006.01)

(56) References Cited

U.S. PATENT DOCUMENTS

| | | | |
|---|---|---|---|
| 2015/0047788 A1* | 2/2015 | Kanda | H05K 13/0417 156/767 |
| 2015/0223374 A1* | 8/2015 | Nozawa | H05K 13/0417 29/739 |
| 2015/0245549 A1* | 8/2015 | Kurita | H05K 3/32 228/102 |
| 2017/0181341 A1* | 6/2017 | Yamamoto | H05K 3/303 |

\* cited by examiner

COMPONENT SUPPLY DEVICE, COMPONENT MOUNTER, AND COMPONENT-MOUNTED BOARD MANUFACTURING METHOD

BACKGROUND

1. Technical Field

The present disclosure relates to a component supply device that supplies a component provided with a body portion and a lead portion extending downwards from the body portion to a component supply position and relates to a component mounter including the component supply device.

2. Description of the Related Art

In the related art, as one of component mounters which install a component on a board, a component mounter has been known in which an installing head sucks a component (leaded component) including a body portion and a lead portion extending downwards from the body portion and picks up the component and the component is installed on a board with the lead portion being inserted into an insertion hole formed in the board. A component supply device, which supplies the component to a predetermined component supply position in such a component mounter, includes a tape travel mechanism that causes a tape member holding the lead portion to pitch-travel in a horizontal direction such that the component is transported while standing upright and the component is positioned in the component supply position. The component supply device further includes a cutter that cuts the lead portion of the component that has been positioned in the component supply position by the tape travel mechanism and separates the component from the component holding tape. The cutter is configured to cut the lead portion by using a pair of cutting members with the lead portion being interposed between the pair of cutting members, the cutting members arranged in a direction orthogonal to a traveling direction (component transportation direction) of the component holding tape in which the tape travel mechanism causes the component holding tape to travel (for example, refer to PTL 1).

CITATION LIST

Patent Literature

PTL 1: Japanese Patent No. 5864294

SUMMARY

A component supply device causes a component holding tape that holds a component provided with a body portion and a lead portion to travel such that the component is supplied to a component supply position.

The component supply device includes a posture maintainer and a pair of cutting members.

The posture maintainer includes a pair of grip members, each of which includes a tip end portion that extends in a traveling direction of a component holding tape. The posture maintainer maintains the posture of a component by gripping a body portion of the component having been supplied to a component supply position with the body portion interposed between the tip end portions of the pair of the grip members.

The pair of cutting members cuts a lead portion of the component having been gripped by the pair of grip members with the lead portion interposed between the pair of cutting members in a direction intersecting a traveling direction of the component holding tape.

A component mounter includes the above-described component supply device, a board transport mechanism, and an installing head.

The board transport mechanism transports a board such that the board is positioned in a working position.

The installing head sucks the body portion of the component that has been supplied to the component supply position by the component supply device to pick up the component and installs the component on the board that has been positioned in the working position.

A component-mounted board manufacturing method is performed by using a component mounter.

The component mounter includes a component supply device, a board transport mechanism, and an installing head.

The component supply device causes a component holding tape that holds a component provided with a body portion and a lead portion to travel such that the component is supplied to a component supply position.

The board transport mechanism transports a board such that the board is positioned in a working position.

The installing head sucks the body portion of the component that has been supplied to the component supply position by the component supply device to pick up the component and installs the component on the board that has been positioned in the working position.

The component supply device includes a pair of grip members, each of which includes a tip end portion that extends in a traveling direction of the component holding tape.

The component-mounted board manufacturing method includes maintaining a posture of the component by gripping the body portion of the component having been supplied to the component supply position with the body portion interposed between the tip end portions of the pair of the grip members and causing a pair of cutting members to cut the lead portion of the component having been gripped by the pair of grip members with the lead portion interposed between the pair of cutting members in a direction intersecting the traveling direction of the component holding tape.

DETAILED DESCRIPTION

In the component supply device in the related art, when the lead portion is sandwiched by the pair of cutting members, the entire portion of the component may become inclined with a cutting direction (horizontal direction orthogonal to traveling direction of component holding tape) and the posture of the component may be changed from an initial posture (standing-upright posture), so that the installing head fails to pick up the component.

Figure 1:
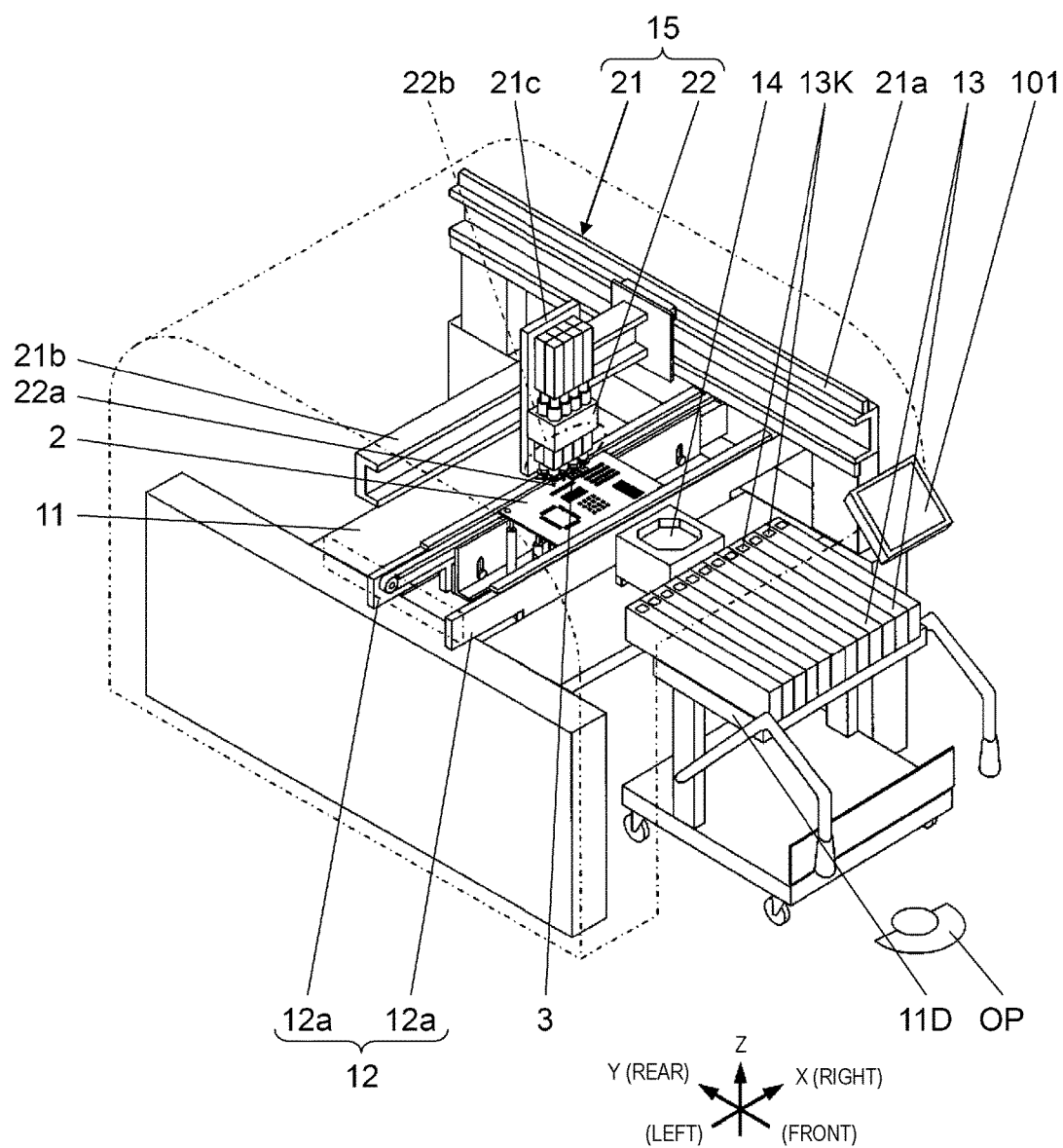
FIG. 1 is a perspective view of a component mounter according to an embodiment.

Hereinafter, an embodiment will be described with reference to drawings. FIG. 1 illustrates component mounter 1 according to the embodiment. Component mounter 1 is a device that installs component 3 on board 2. Component mounter 1 includes base table 11, board transport mechanism 12, a plurality of component supply devices 13, component camera 14, and component installing mechanism 15. Here, the right-left direction of component mounter 1 as seen from operator OP will be referred to as an X axis direction and the front-rear direction will be referred to as a Y axis direction, for convenience of explanation. In addition, the vertical direction will be referred to as a Z axis direction.

In FIG. 1, board transport mechanism 12 in FIG. 1 transports board 2 in the X axis direction (direction from left side to right side) by using a pair of front and rear conveyer mechanisms 12a such that board 2 is positioned in a predetermined working position which is in the vicinity of the central portion of base table 11. Component supply devices 13 are provided in carriage 11D while being arranged in the X axis direction, carriage 11D attached to a front portion of base table 11 (on front side as seen from operator OP).

In FIG. 1, each of component supply devices 13 includes component supply port 13K, which is provided at an end portion on the rear side (on the rear side as seen from operator OP), and continuously supplies component 3 to component supply position 13P (FIG. 2) immediately below component supply port 13K. In the present embodiment, as illustrated in FIG. 3, component 3, which is supplied to component supply position 13P by each of component supply devices 13 in the embodiment, is a leaded component that includes cylindrical body portion 3B and two lead portions 3R which extend downwards from body portion 3B. Details of the configuration of component supply device 13 will be described later.

In FIG. 1, component camera 14 is provided in a region between board transport mechanism 12 of base table 11 and component supply devices 13. The imaging visual field of component camera 14 is above component camera 14.

In FIG. 1, component installing mechanism 15 is configured to include head moving mechanism 21 which is provided on base table 11 and installing head 22 which is moved by head moving mechanism 21. Head moving mechanism 21 includes fixed table 21a, moving table 21b, and moving plate 21c. Fixed table 21a extends in the Y axis direction at one end portion of base table 11 in the X axis direction (here, the right end portion). Opposite end portions of fixed table 21a are fixed to base table 11. Moving table 21b extends in the X axis direction. One end portion of moving table 21b (right end portion) is able to freely move along fixed table 21a. Moving plate 21c is provided to be able to freely move along moving table 21b. Installing head 22 is attached to moving plate 21c.

In FIG. 1, installing head 22 includes a plurality of suction nozzles 22a. Each of suction nozzles 22a extends downwards and a lower end of each suction nozzle is provided with a component suction port. Installing head 22 includes suction control mechanism 22b and suction control mechanism 22b is connected to a vacuum source (not shown). Suction control mechanism 22b controls vacuum pressure supplied from the vacuum source so as to generate vacuum suction force in the component suction port of each suction nozzle 22a.

Head moving mechanism 21 moves moving table 21b relative to fixed table 21a in the Y axis direction and moves moving plate 21c relative to moving table 21b in the X axis direction such that installing head 22 is moved within a horizontal plane (XY plane). Installing head 22 causes each suction nozzle 22a to descend from a position above component supply port 13K of each component supply device 13 and to vacuum suck body portion 3B of component 3 with body portion 3B coming into contact with a lower end of suction nozzle 22a so as to pick up component 3 having been supplied to component supply position 13P (FIGS. 2 and 3).

Figure 2:
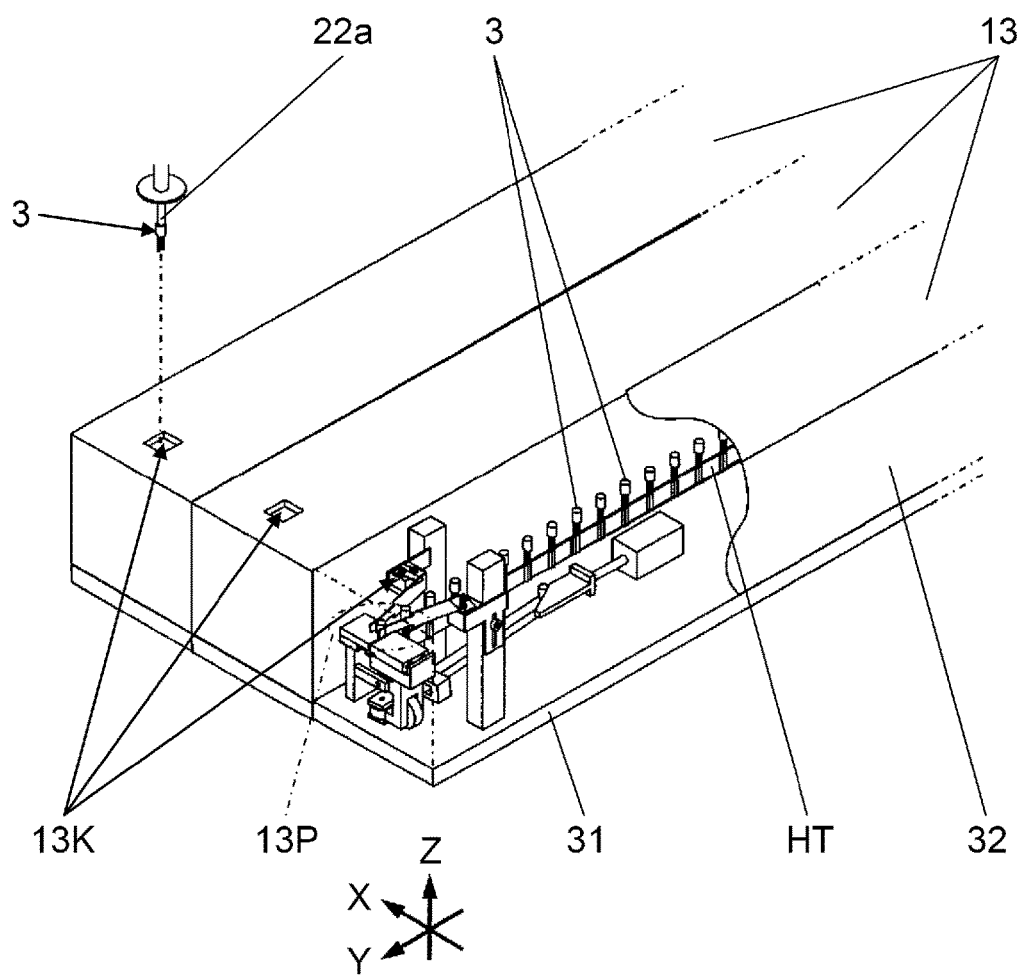
FIG. 2 is a see-through perspective view of a portion of a component supply device according to the embodiment.
Figure 3:
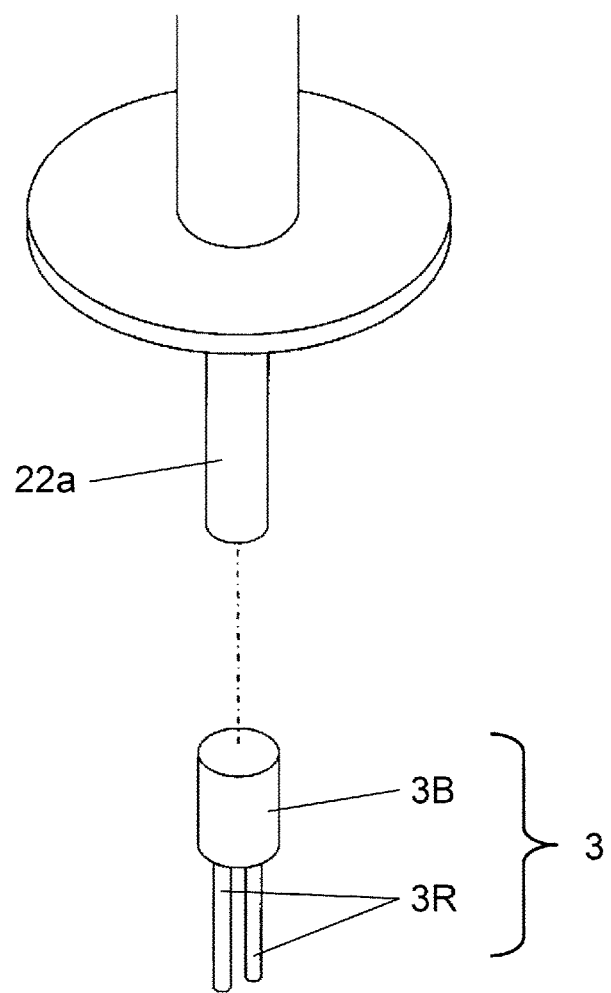
FIG. 3 is a perspective view illustrating a suction nozzle of the component mounter according to the embodiment along with a component.
Figure 4:
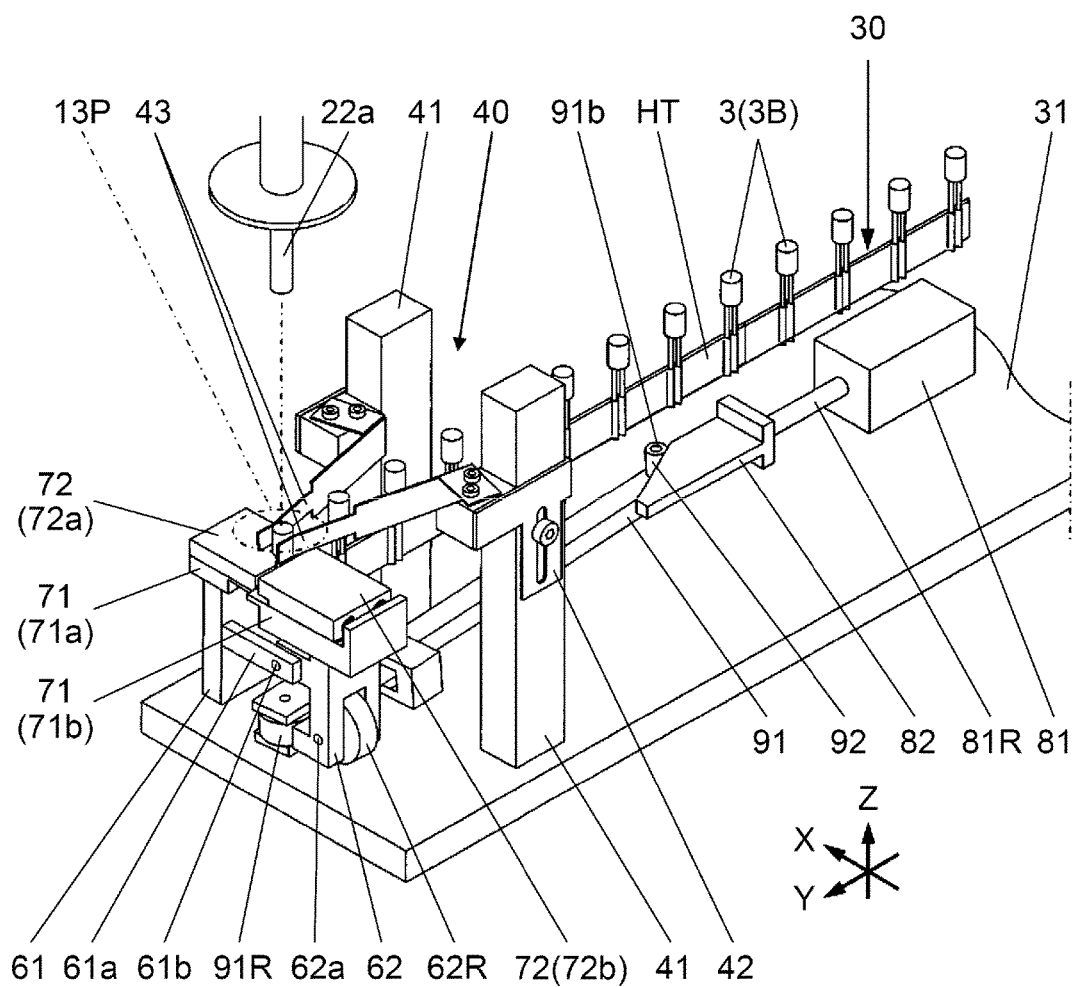
FIG. 4 is a perspective view of a portion of the component supply device according to the embodiment.
Figure 5:
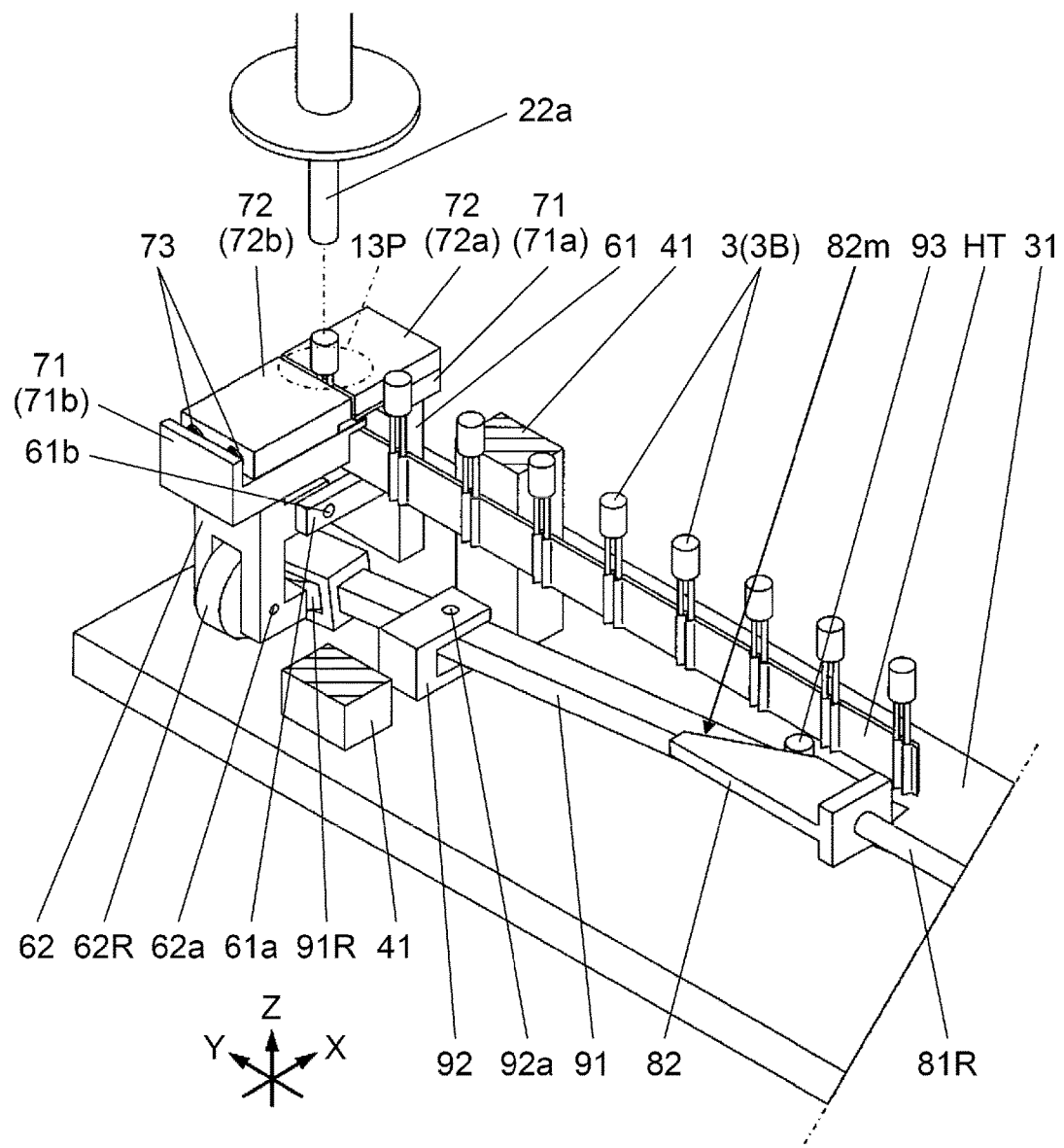
FIG. 5 is a perspective view of a portion of the component supply device according to the embodiment.

Each of component supply devices 13 includes base portion 31 which is connected to carriage 11D and cover portion 32 which is attached to base portion 31 (FIG. 2). Tape travel mechanism 30 is provided in a region on base portion 31 that is covered by cover portion 32(FIG. 4). Tape travel mechanism 30 introduces component holding tape HT that holds lead portions 3R of components 3 from the outside and causes component holding tape HT to pitch-travel in a horizontal direction (rearward) such that components 3 are supplied to component supply position 13P (FIGS. 3, 4, and 5).

Figure 6:
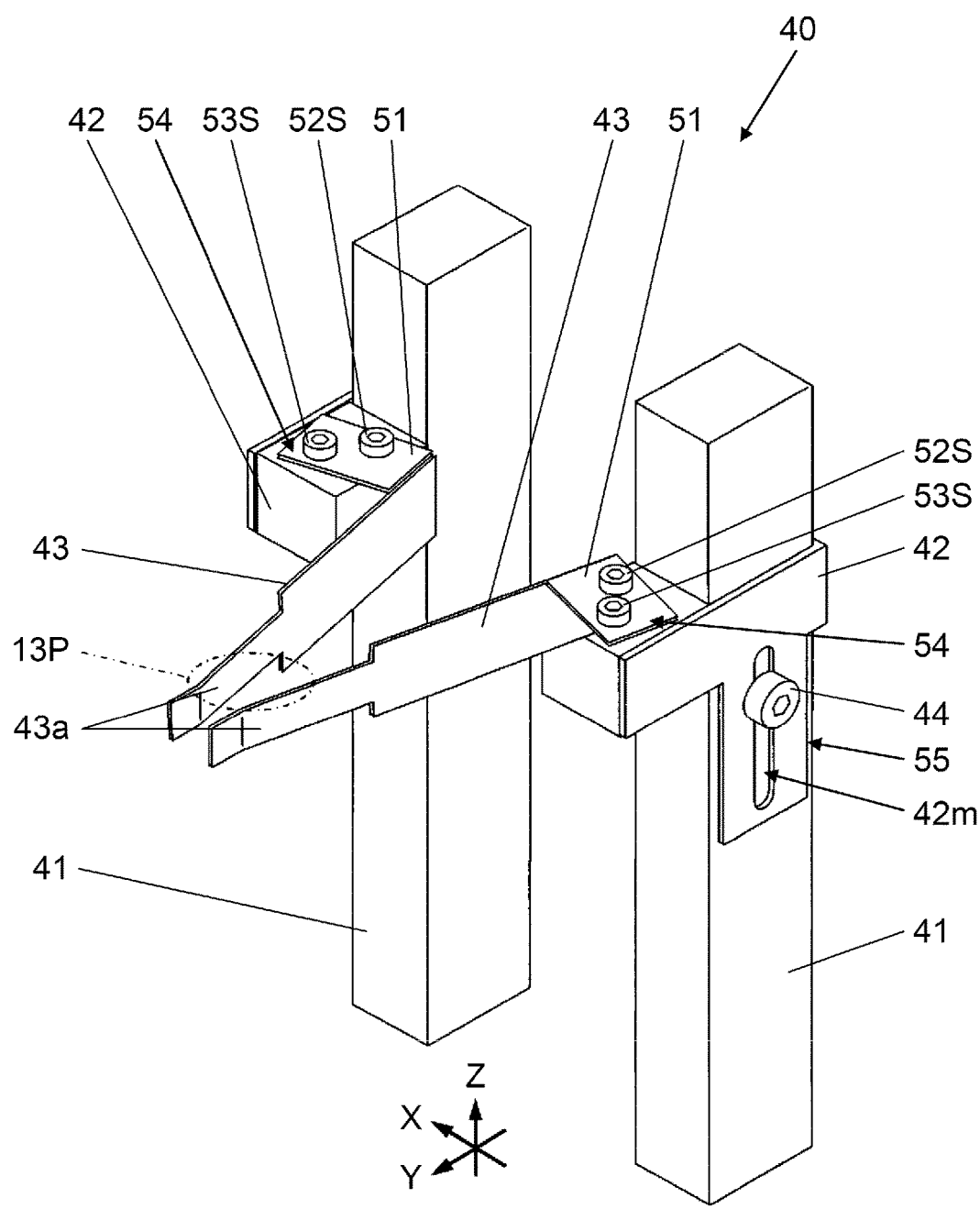
FIG. 6 is a perspective view of a posture maintainer of the component supply device according to the embodiment.
Figure 7:
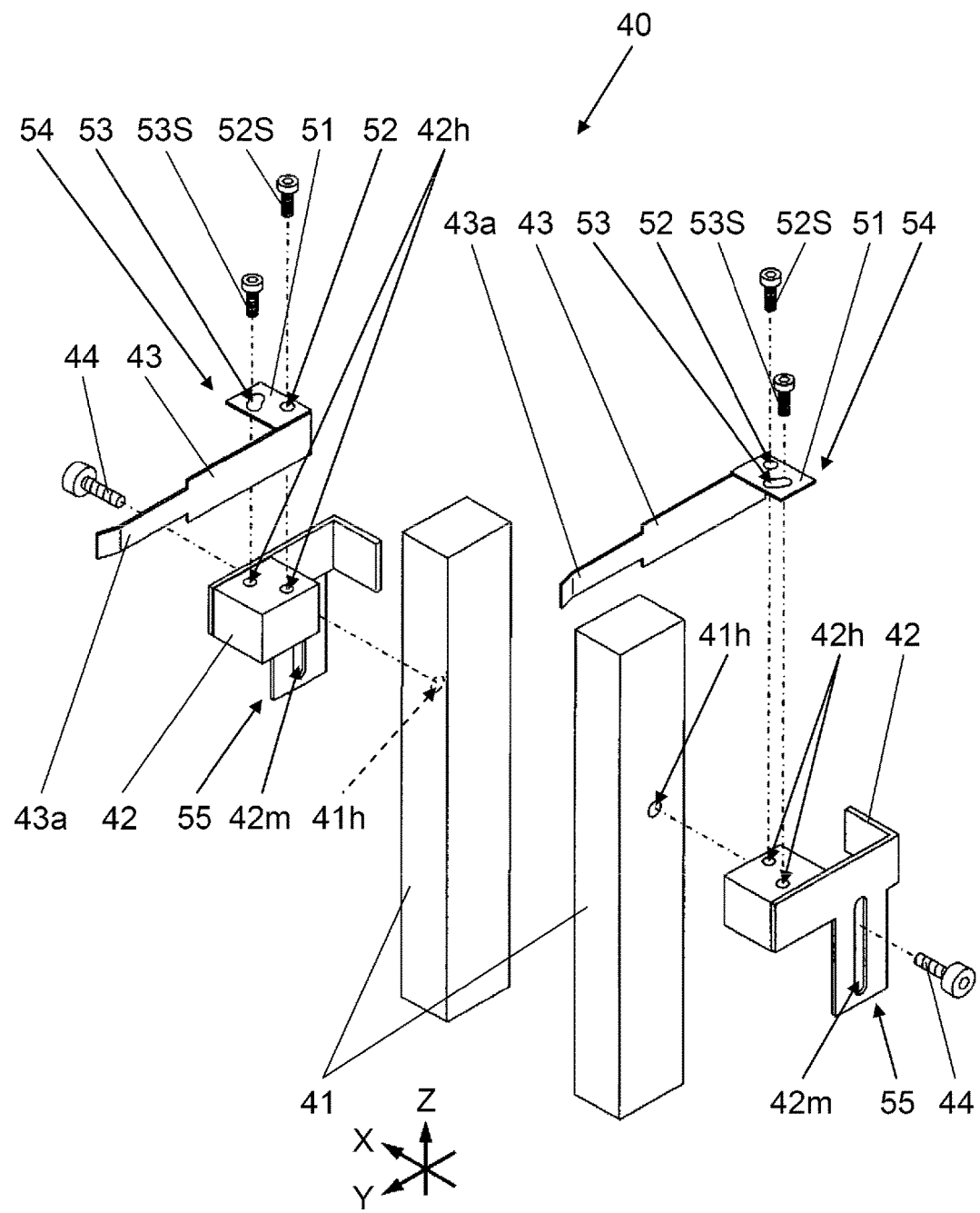
FIG. 7 is an exploded perspective view of the posture maintainer of the component supply device according to the embodiment.

In FIG. 4, posture maintainer 40 is provided on a rear end region on base portion 31. As illustrated in FIGS. 6 and 7, posture maintainer 40 is configured to include a pair of columns 41 that are disposed on base portion 31 to face each other in the X axis direction, position adjustment member 42 that is provided on the central portion of each of the pair of columns 41, and a pair of grip members 43 that are respectively attached to the pair of position adjustment members 42.

In FIGS. 6 and 7, each column 41 extends in the Z axis direction and each position adjustment member 42 is fixed to column 41 with fixation screw 44. Each grip member 43 has a shape that extends in the front-rear direction as a whole. In the present embodiment, each of the pair of grip members 43 is a plate-shaped metal member.

Figure 8:
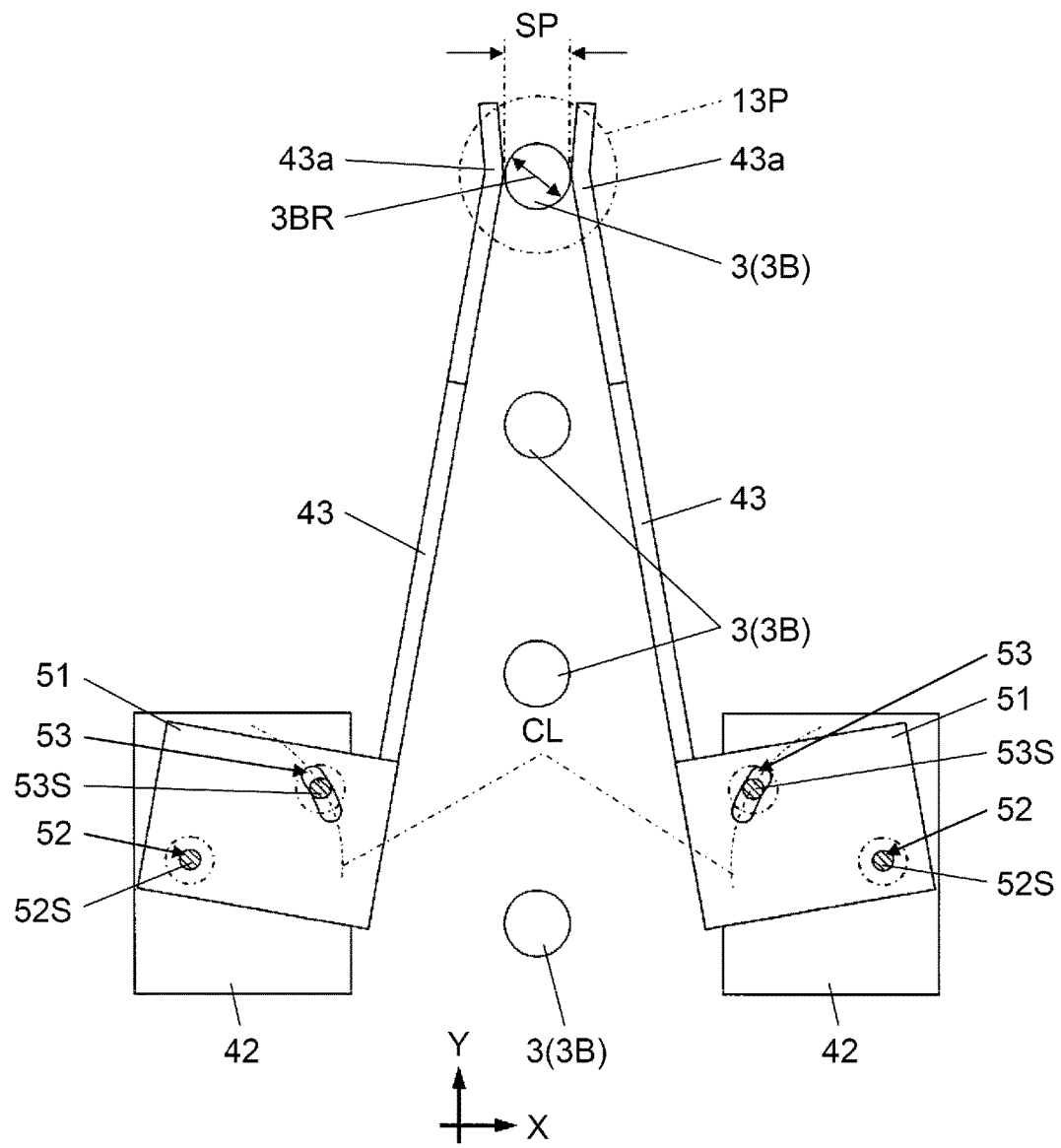
FIG. 8 is a plan view illustrating a state where the posture maintainer of the component supply device according to the embodiment has gripped a body portion of the component.

In FIGS. 6, 7, and 8, tip end portion 43a of each of the pair of grip members 43 extends from the upstream side to the downstream side (here, from the front side to the rear side) in a traveling direction of component holding tape HT, in which tape travel mechanism 30 causes component holding tape HT to travel (transportation direction of component 3

(Y axis direction)). The pair of grip members 43 has a function of maintaining the posture of component 3 by gripping lateral side portions (in X axis direction) of body portion 3B of component 3 having been supplied to component supply position 13P by component holding tape HT, which tape travel mechanism 30 causes to travel, with body portion 3B interposed between tip end portions 43a.

In FIGS. 6, 7, 8, and 9, horizontally extending ear portion 51 is formed while being close to a base end portion (rear end portion) of each grip member 43. Each ear portion 51 is provided with axial hole 52 and adjustment hole 53. As illustrated in FIGS. 7 and 8, adjustment hole 53 is formed to have arc shape CL formed around axial hole 52. Axial hole screw 52S is inserted into axial hole 52 of each grip member 43 from above and adjustment hole screw 53S is inserted into adjustment hole 53 of each grip member 43 from above. Axial hole screw 52S and adjustment hole screw 53S are respectively screwed into two screw holes 42h which are provided in each position adjustment member 42 (FIG. 7).

Each grip member 43 is fixed to each position adjustment member 42 (that is, to column 41) with axial hole screw 52S and adjustment hole screw 53S. It is possible to change the posture of grip member 43 with respect to position adjustment member 42 and the position of tip end portion 43a of grip member 43 in the right-left direction by rotating grip member 43 around axial hole screw 52S in a state where axial hole screw 52S and adjustment hole screw 53S in screw holes 42h have been loosened. Therefore, it is possible to adjust the gap between tip end portions 43a of the pair of grip members 43 corresponding to outer diameter 3BR of body portion 3B of component 3 transported through component holding tape HT (FIGS. 8 and 9).

Figure 9:
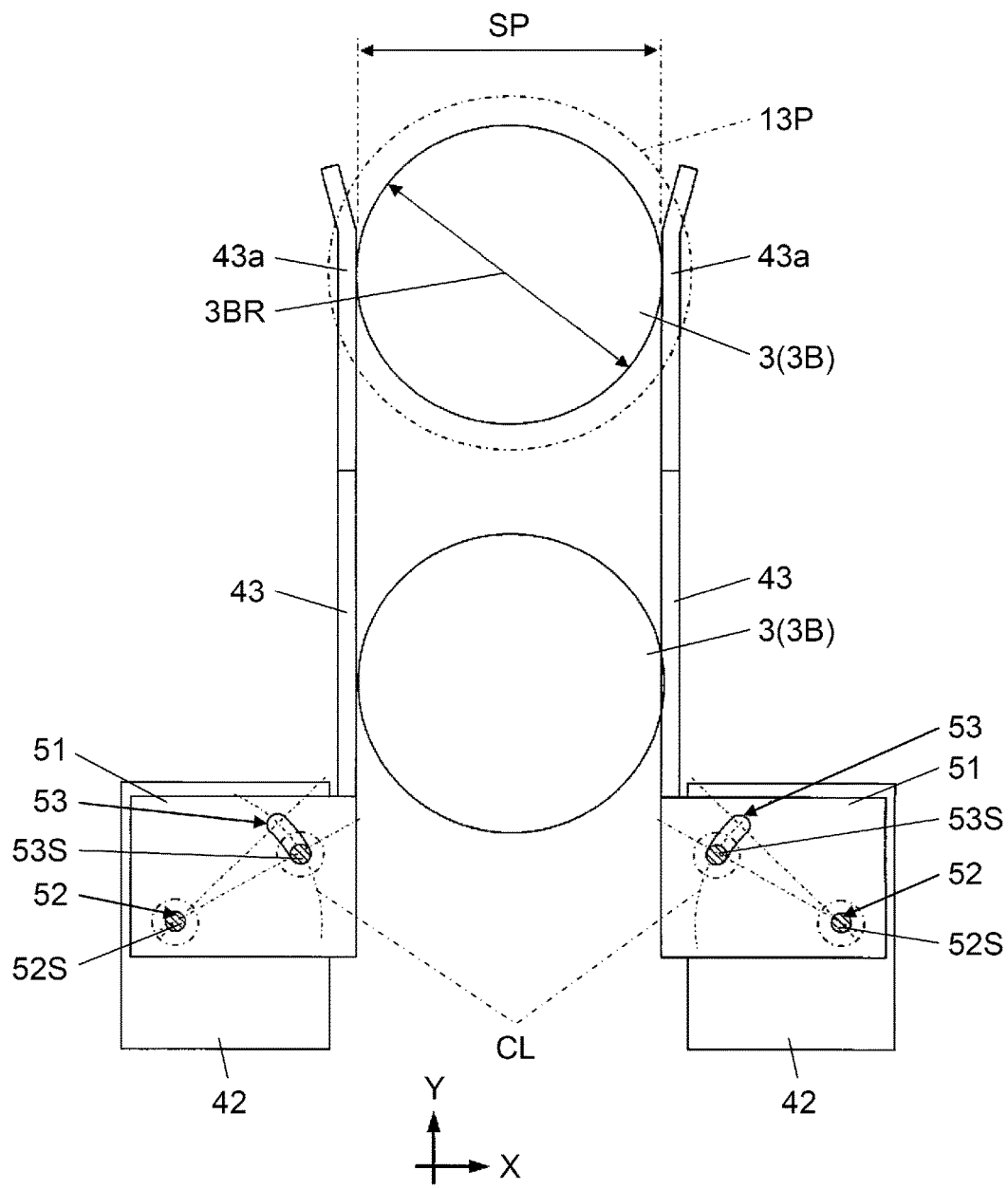
FIG. 9 is a plan view illustrating a state where the posture maintainer of the component supply device according to the embodiment has gripped the body portion of the component.

As illustrated in FIGS. 8 and 9, the dimension of gap SP between tip end portions 43a of the pair of grip members 43 is set such that body portion 3B of component 3 positioned at component supply position 13P can be gripped. Therefore, gap SP between tip end portions 43a of the pair of grip members 43 needs to coincide with outer diameter 3BR of body portion 3B of component 3. In the present embodiment, grip member 43 is a plate-shaped metal member and is elastically deformable in a direction intersecting the traveling direction (transportation direction of component 3) of component holding tape HT in which tape travel mechanism 30 causes component holding tape HT to travel. Therefore, the gap between tip end portions 43a may be slightly smaller than outer diameter 3BR of body portion 3B so that component 3 is elastically gripped (elastic gripping process). In this case, it becomes significantly easy to adjust the gap between tip end portions 43a.

As described above, in the present embodiment, each of the pair of grip members 43 is attached to each of the pair of columns 41 that are provided such that columns 41 are positioned close to opposite lateral sides in the X axis direction of component holding tape HT, which tape travel mechanism 30 causes to travel, with component holding tape HT interposed between the pair of columns 41. The gap between tip end portions 43a of the pair of grip members 43 can be changed by changing an attachment position of the pair of grip members 43 with respect to the pair of columns 41. In the present embodiment, axial hole 52 and adjustment hole 53, which are provided in each of the pair of grip members 43, and axial hole screw 52S and adjustment hole screw 53S, which are inserted into axial hole 52 and adjustment hole 53, function as gap changing means 54 for changing the gap between tip end portions 43a of the pair of grip members 43.

As understood from FIG. 8, when outer diameter 3BR of component 3 is relatively small, the gap between the pair of grip members 43 gradually decreases in the traveling direction of component holding tape HT. Therefore, component 3 transported through component holding tape HT is guided by the pair of grip members 43 and reaches component supply position 13P. As a result, even in a case where an initial posture of component 3 is slightly inclined in a lateral direction (X axis direction) while not standing upright, the inclination is corrected and component 3 is supplied to component supply device 13P while standing upright.

In FIGS. 6 and 7, each position adjustment member 42 is provided with long hole 42m for vertical position adjustment which extends in the vertical direction. Fixation screw 44 is screwed into fixation screw hole 41h of each column 41 while being inserted into long hole 42m. Each position adjustment member 42 is fixed to each column 41 with fixation screw 44. It is possible to change the position of position adjustment member 42 (that is, position of grip member 43) with respect to column 41 in the vertical direction by moving position adjustment member 42 with respect to column 41 in the vertical direction in a state where fixation screw 44 in fixation screw hole 41h has been loosened. Therefore, it is possible to adjust the height of the pair of grip members 43 corresponding to the height dimension of body portion 3B of component 3 transported through component holding tape HT.

As described above, in the present embodiment, each of the pair of grip members 43 is attached to each of the pair of position adjustment members 42 that are respectively attached to the pair of columns 41. In addition, it is possible to change the position of the pair of grip members 43 in the vertical direction by changing the attachment position of the pair of position adjustment members 42 with respect to the pair of columns 41. In the present embodiment, long hole 42m provided in position adjustment member 42 and fixation screw 44 installed in long hole 42m function as height changing means 55 for changing the height of grip member 43 in the vertical direction.

In FIGS. 4 and 5, fixed body 61 and swinging body 62 are positioned behind column 41 on the right side. Fixed body 61 is provided to be fixed to base portion 31 and is provided with a pair of arm portions 61a each of which extends rightwards. The pair of arm portions 61a supports the front and rear end portions of swinging shaft 61b which extends in the Y axis direction and swinging shaft 61b passes through swinging body 62 in the Y axis direction. Therefore, swinging body 62 can freely swing around swinging shaft 61b (that is, with respect to fixed body 61) and around a Y axis.

Figure 10A:
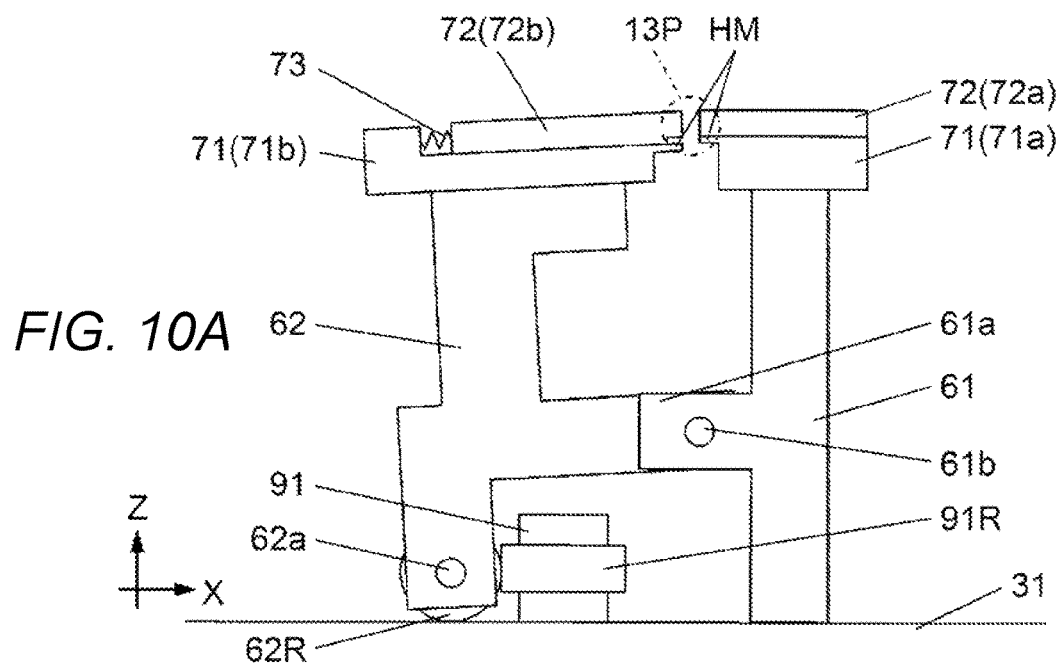
FIGS. 10A and 10B are views for explaining the operation of a swinging body of the component supply device according to the embodiment.
Figure 10B:
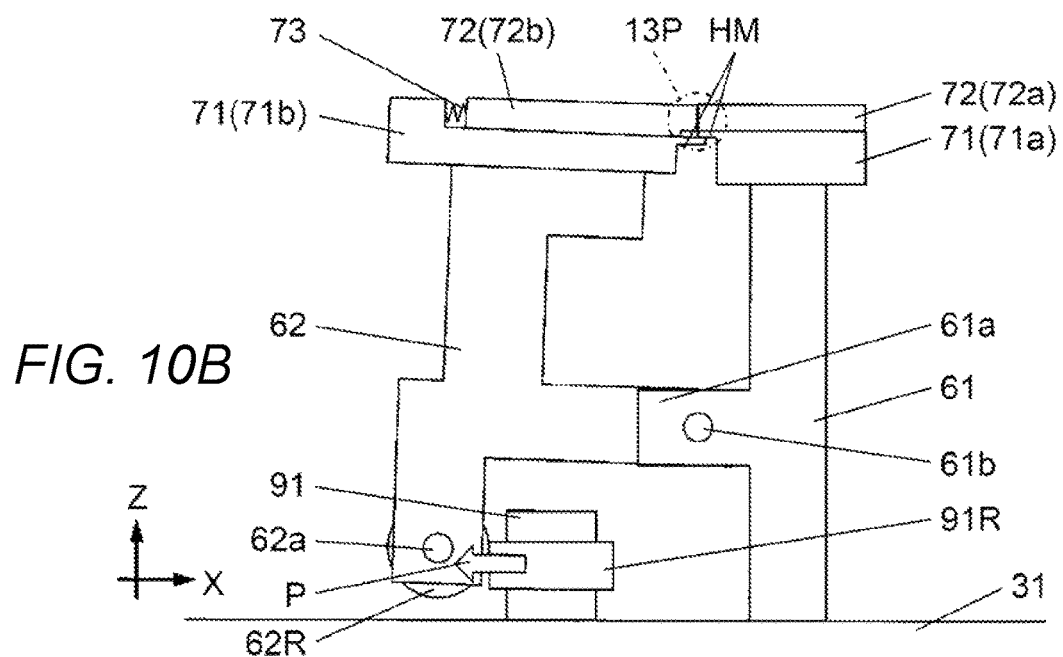

In FIGS. 4 and 5 and FIGS. 10A and 10B, fixed body 61 and swinging body 62 are provided with a pair of cutting members 71 and a pair of clamping members 72. The pair of cutting members 71 includes fixed cutting member 71a and movable cutting member 71b which moves relative to fixed cutting member 71a. Fixed cutting member 71a is disposed on the right side of component holding tape HT and movable cutting member 71b is disposed on the left side of component holding tape HT. Each of a left end portion of fixed cutting member 71a and a right end portion of movable cutting member 71b is formed as edge surface HM (FIGS. 10A and 10B). The pair of cutting members 71 has a function of cutting lead portions 3R of component 3, of which body portion 3B has been gripped by the pair of grip members 43, with lead portions 3R interposed between the pair of cutting members 71 in a horizontal direction (X axis direction) intersecting the traveling direction of component holding tape HT.

In FIGS. 4 and 5 and FIGS. 10A and 10B, the pair of clamping members 72 includes fixed clamping member 72a and movable clamping member 72b. Fixed clamping member 72a is disposed above fixed cutting member 71a and is integrally provided with fixed cutting member 71a. Movable clamping member 72b is provided on movable cutting member 71b such that movable clamping member 72b is able to freely slide relative to movable cutting member 71b. Movable clamping member 72b is connected to movable cutting member 71b via urging spring 73 which is an elastic member (FIG. 5 and FIGS. 10A and 10B). Urging spring 73 urges movable clamping member 72b in a direction toward fixed clamping member 72a (here, direction toward the right side). The pair of clamping members 72 has a function of clamping lead portions 3R of component 3 that has been supplied to component supply position 13P through component holding tape HT, which tape travel mechanism 30 causes to travel, and of which body portion 3B has been gripped by the pair of grip members 43.

In FIGS. 4 and 5 and FIGS. 10A and 10B, a lower end of swinging body 62 is provided with roller member supporting shaft 62a which extends in the Y axis direction. Roller member 62R is attached to roller member supporting shaft 62a such that roller member 62R can freely rotate around roller member supporting shaft 62a (that is, around Y axis).

Figure 11:
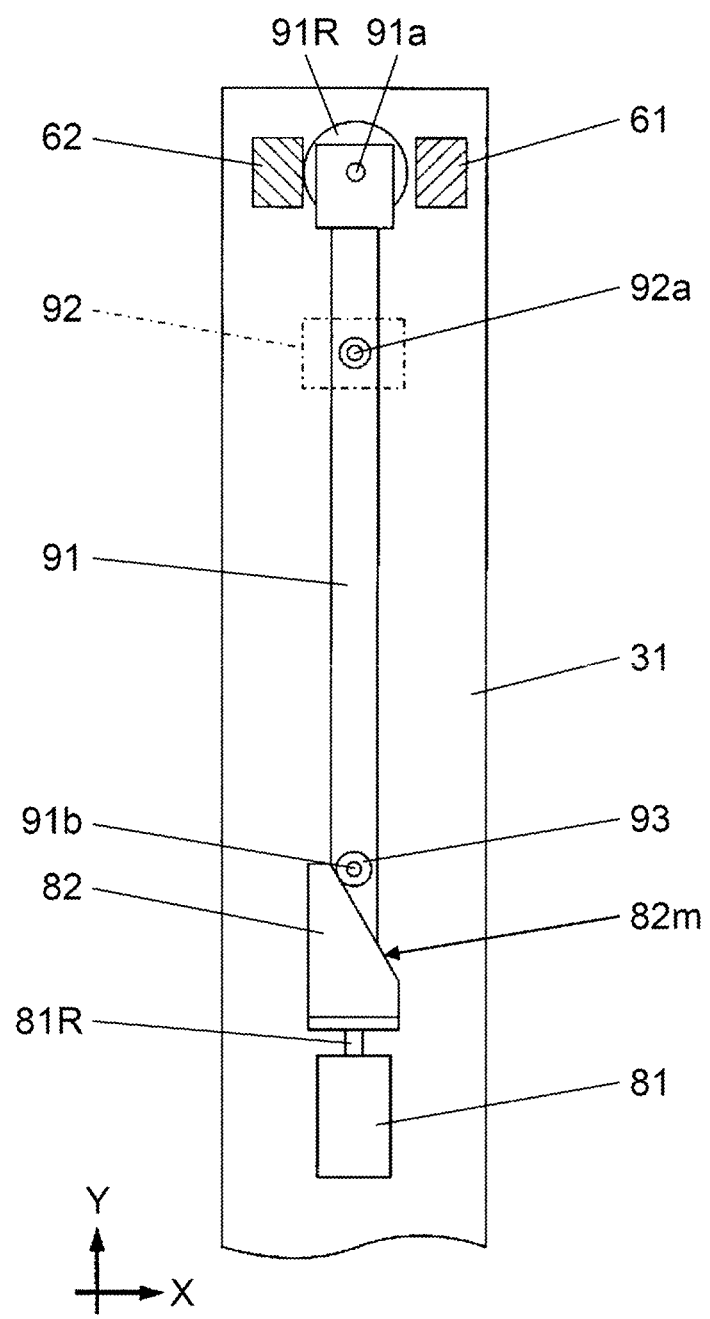
FIG. 11 is a plan view of a portion of the component supply device according to the embodiment.

In FIGS. 4 and 11, driving cylinder 81 is provided at a position closer to the front side than the pair of columns 41 on base portion 31 is. Piston rod 81R of driving cylinder 81 extends rearwards and the tip end thereof is provided with plate cam 82. Plate cam 82 includes cam surface 82m which is an inclined surface (also refer to FIG. 5).

In FIGS. 4, 5, and 11, lever member 91 is provided on base portion 31 and extends in the Y axis direction. Lever member supporting block 92 is provided at a position on base portion 31 that corresponds to an intermediate portion of lever member 91 and shaft member 92a extending in the Z axis direction is provided (FIGS. 5 and 11). The intermediate portion of lever member 91 is supported by shaft member 92a and is able to freely swing within an XY plane.

In FIGS. 4, 5, and 11, a rear end of lever member 91 is provided with pressing roller 91R. Pressing roller 91R is provided such that pressing roller 91R can freely rotate around roller supporting shaft 91a which is provided in the rear end of lever member 91 to extend in the Z axis direction. A front end portion of lever member 91 is provided with cam follower 93. Cam follower 93 is provided such that cam follower 93 can freely rotate around cam follower supporting shaft 91b which extends in the Z axis direction from an upper surface of the front end portion of lever member 91 (FIG. 11).

Swing body 62 operates as follows due to the relationship between the position of swinging shaft 61b and the center of gravity of swinging body 62 including roller member 62R. In a state where a pressing force in a lateral direction (X axis direction) does not act on a lower end portion of swinging body 62, roller member 62R abuts onto an upper surface of base portion 31 and a right end of movable cutting member 71b faces an upper right space (FIG. 10A). In this state, movable cutting member 71b is positioned at an initial position at which movable cutting member 71b is separated from fixed cutting member 71a being positioned leftward of fixed cutting member 71a. That is, when swinging body 62 is in the initial position, a right end of movable clamping member 72b protrudes rightwards from the right end of movable cutting member 71b.

Figure 12A:
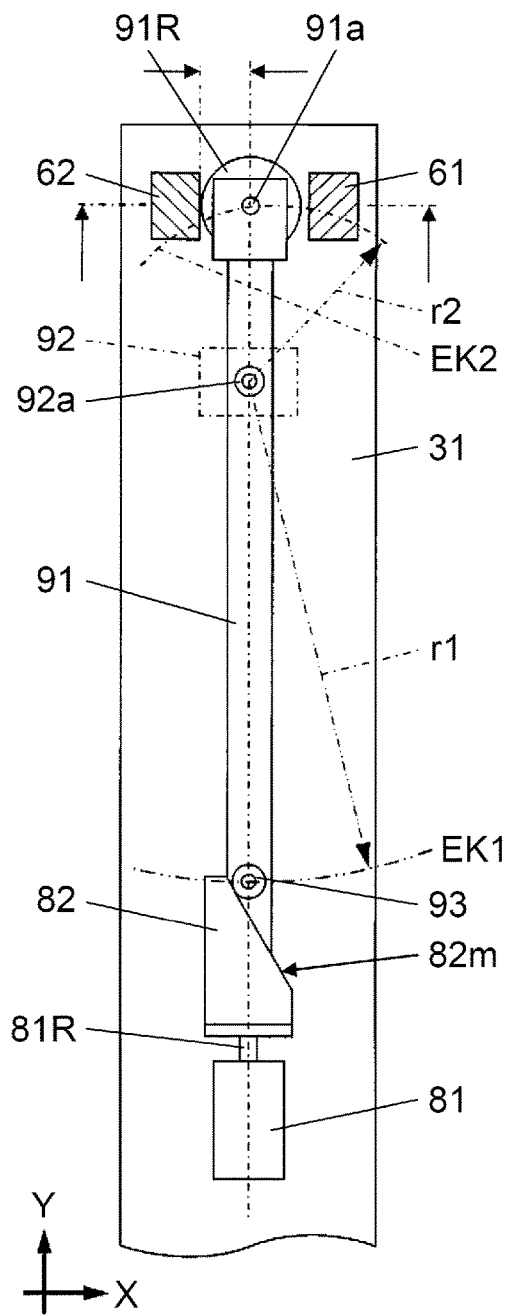
FIGS. 12A and 12B are views for explaining the operation of a lever member of the component supply device according to the embodiment.

Plate cam 82 moves between a front position (FIG. 12A), which is the most front position in positions to which plate cam 82 is positioned by driving cylinder 81, and a rear position (FIG. 12B), which is the most rear position in positions to which plate cam 82 is positioned by driving cylinder 81. In a state where plate cam 82 is in the front position, cam follower 93 abuts onto cam surface 82m of plate cam 82 but cam follower 93 is not pressed by driving cylinder 81. Therefore, when swinging body 62 is in the initial position, swinging body 62 does not receive a leftward pressing force from lever member 91 even when swinging body 62 is in contact with pressing roller 91R (FIG. 10A and FIG. 12A).

When driving cylinder 81 is operated and plate cam 82 moves from the front position to the rear position, cam follower 93 is pressed by plate cam 82 via cam surface 82m and moves rightwards along first arc-shaped track EK1 with radius r1, which is formed around shaft member 92a. As a result, pressing roller 91R moves leftwards along second arc-shaped track EK2 with radius r2, which is formed around shaft member 92a (FIG. 12A->FIG. 12B), and presses a lower end of swinging body 62 leftwards (arrow P in FIG. 10B). When the lower end of swinging body 62 is pressed leftwards, swinging body 62 swings around swinging shaft 61b, movable clamping member 72b approaches fixed clamping member 72a, and movable cutting member 71b approaches fixed cutting member 71a (FIG. 10A->FIG. 10B). Here, radius r1 is set to be larger than radius r2 and lever member 91 presses swinging body 62 leftwards with a force stronger than a pressing force with which driving cylinder 81 presses cam follower 93 along first arc-shaped track EK1 (with force which is r1/r2 times pressing force at rough estimate).

Figure 13:
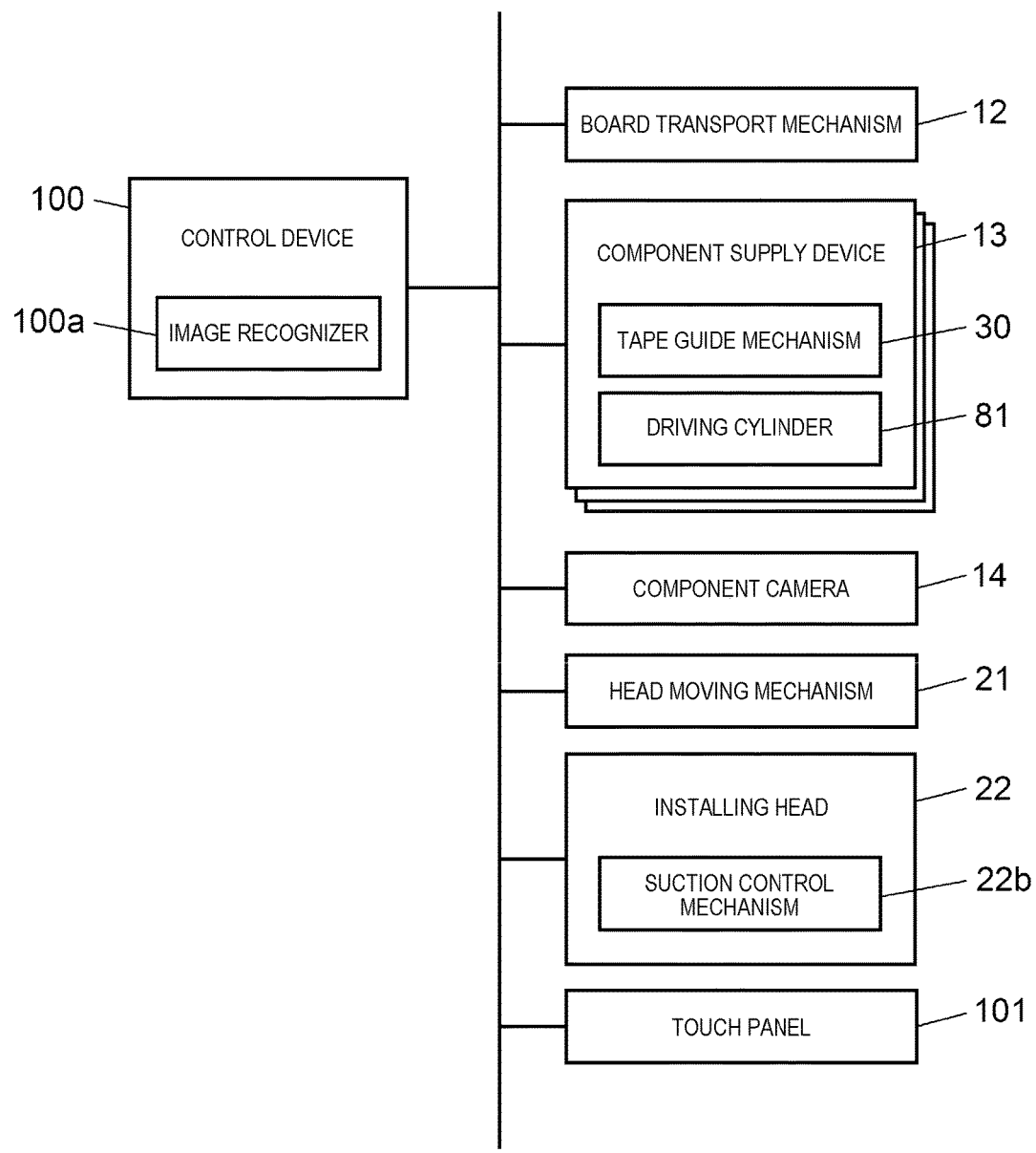
FIG. 13 is a block diagram illustrating a control system in the component mounter according to the embodiment.

In FIG. 13, control device 100 which is included in component mounter 1 controls a transportation operation of board 2 which is performed by board transport mechanism 12, an operation of causing component holding tape HT to travel which is performed by tape travel mechanism 30 in each component supply device 13, a pressing operation of swinging body 62 which is performed by driving cylinder 81, and an imaging operation which is performed by component camera 14. In addition, control device 100 controls a moving operation of installing head 22 which is performed by head moving mechanism 21, a lifting and lowering operation and a rotating operation of suction nozzle 22a which is performed by installing head 22, and an operation of supplying vacuum pressure to a lower end of each suction nozzle 22a which is performed by suction control mechanism 22b. Image data obtained through the imaging operation performed by component camera 14 is transmitted to control device 100 and image recognizer 100a of control device 100 performs image recognition based on the transmitted image data.

In FIG. 13, control device 100 is connected to touch panel 101 (FIG. 1). Touch panel 101 functions as an input device through which operator OP performs a predetermined input operation with respect to control device 100. Furthermore, touch panel 101 functions as an output device through which control device 100 displays the state of component mounter 1 for operator OP or issues operation instruction for operator OP.

Next, a procedure in which component mounter 1 according to the present embodiment installs component 3 on board 2 will be described. In a case where a component installing operation in which component mounter 1 installs component 3 on board 2 is performed, first, operator OP adjusts the position of the pair of grip members 43 corresponding to the size of component 3 to be installed onto board 2, for each component supply device 13. Specifically, operator OP adjusts the gap between tip end portions 43a of the pair of grip members 43 corresponding to outer diameter 3BR of body portion 3B of component 3 (gap adjustment process) and adjusts the height of the pair of grip members 43 corresponding to the height dimension of body portion 3B of component 3 transported through component holding tape HT (vertical position changing process).

After adjusting the position of the pair of grip members 43 in each component supply device 13, operator OP performs an operation for starting the component installing operation by using touch panel 101. When operator OP performs the operation for starting the component installing operation, board transport mechanism 12 is operated while being controlled by control device 100 and receives and transports board 2 supplied from the outside such that board 2 is positioned in a working position. After board 2 is positioned in the working position, head moving mechanism 21 is operated and moves installing head 22 to a position above component supply device 13.

Figure 14A:
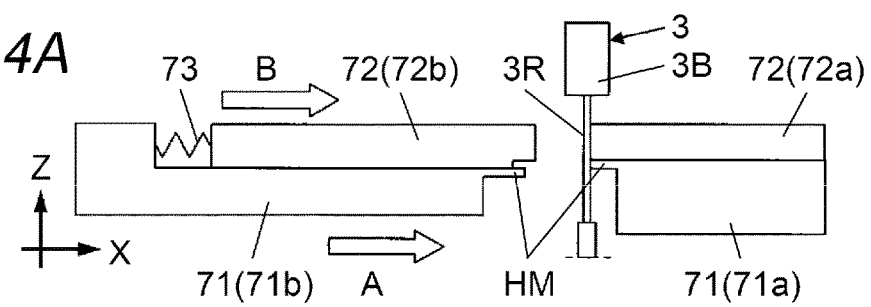
FIGS. 14A to 14D are views for explaining an operation of clamping and cutting a lead portion of the component that is performed by the component supply device according to the embodiment.

When installing head 22 moves to a position above component supply device 13, tape travel mechanism 30 in component supply device 13 causes component holding tape HT to pitch-travel such that component 3 held by component holding tape HT is positioned in component supply position 13P below component supply port 13K. Since body portion 3B of the initial posture (standing-upright posture) of component 3 having been positioned in component supply position 13P is gripped by the pair of grip members 43, the initial posture (standing-upright posture) of component 3 is maintained. When component 3 is positioned in component supply position 13P, two lead portions 3R come into contact with edge surfaces HM of fixed clamping member 72a and fixed cutting member 71a (FIG. 14A).

Figure 12B:
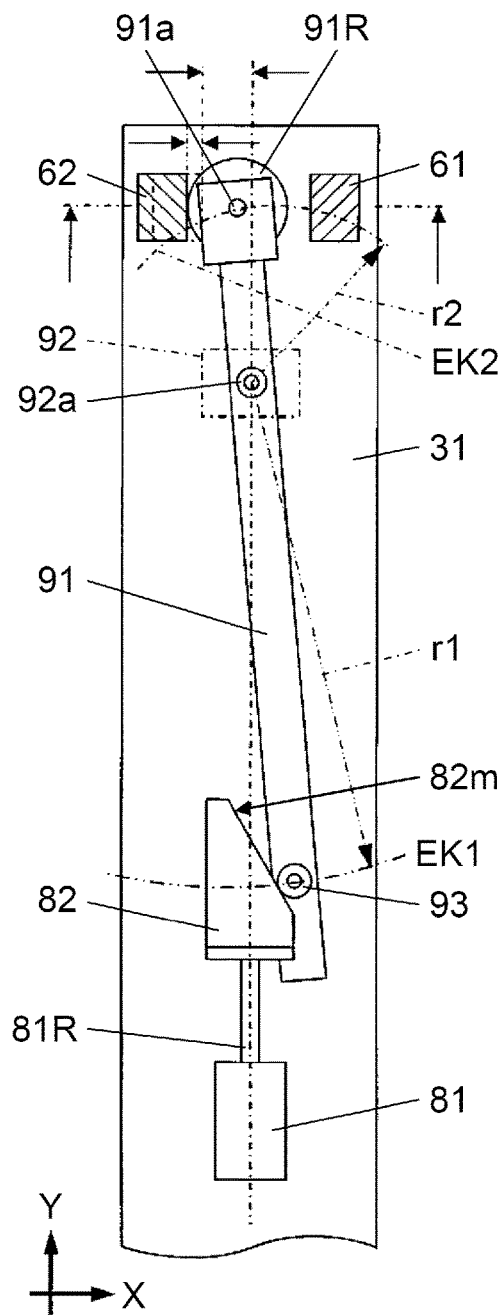
Figure 14B:
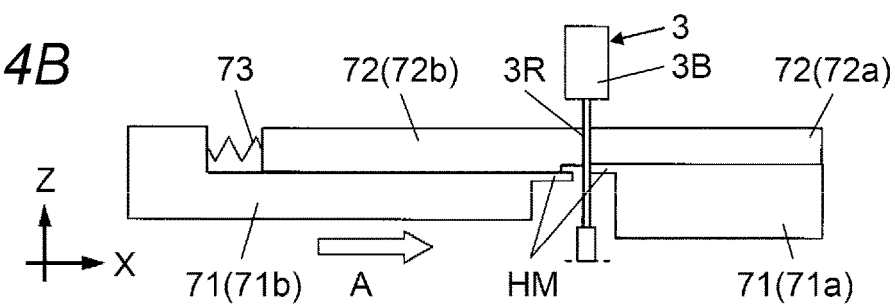

When component 3 reaches the component supply position, driving cylinder 81 is operated and moves plate cam 82 from the front position to the rear position (FIG. 12A->FIG. 12B). Accordingly, lever member 91 swings around roller supporting shaft 91a and pressing roller 91R presses the lower end of swinging body 62 leftwards. As a result, movable cutting member 71b approaches fixed cutting member 71a (arrow A in FIG. 14A) and movable clamping member 72b also approaches fixed clamping member 72a in accordance with the approach (arrow B in FIG. 14A). When movable clamping member 72b and fixed clamping member 72a abut onto each other, movable clamping member 72b and fixed clamping member 72a clamp lead portions 3R with lead portions 3R interposed therebetween (FIG. 14B).

Here, as described above, since the right end of movable clamping member 72b is positioned closer to the right side than the right end of movable cutting member 71b when swinging body 62 is in an initial state, movable clamping member 72b comes into contact with lead portions 3R before movable cutting member 71b comes into contact with lead portions 3R. Thereafter, movable cutting member 71b approaches fixed cutting member 71a so that urging spring 73 is compressed and movable clamping member 72b is urged toward fixed clamping member 72a due to an elastic force generated by urging spring 73. When movable clamping member 72b abuts onto fixed clamping member 72a, lead portions 3R are clamped.

Figure 14C:
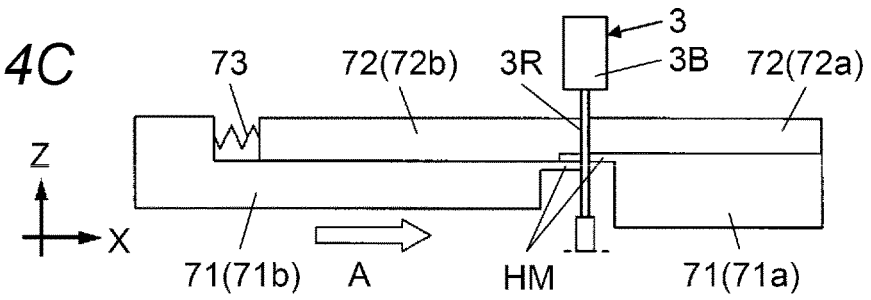
Figure 14D:
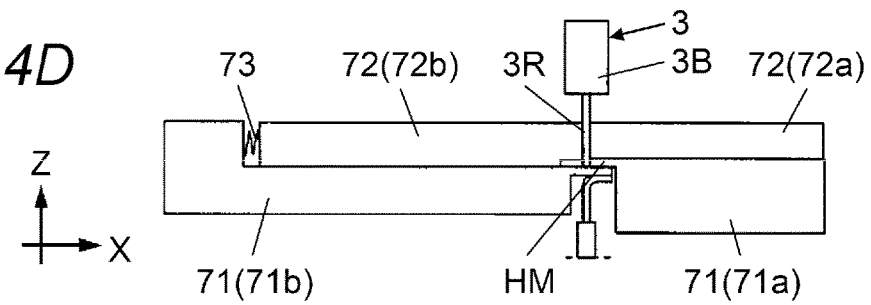

After lead portions 3R are clamped between movable clamping member 72b and fixed clamping member 72a as described above, movable cutting member 71b slides and moves rightwards (toward fixed cutting member 71a) relative to movable clamping member 72b while compressing urging spring 73 and comes into contact with lead portions 3R (FIG. 14C). Then, movable cutting member 71b moves further rightwards and moves such that edge surface HM thereof is positioned below edge surface HM of fixed cutting member 71a. As a result, lead portions 3R are sandwiched by edge surface HM of movable cutting member 71b and edge surface HM of fixed cutting member 71a and cut (sheared) (FIG. 14D).

As described above, in the present embodiment, when movable cutting member 71b approaches fixed cutting member 71a in a state where lead portions 3R are positioned between the pair of cutting members 71, movable clamping member 72b comes into contact with lead portions 3R before movable cutting member 71b comes into contact with lead portions 3R, and thus lead portions 3R are clamped between movable cutting member 71b and fixed clamping member 72a. Thereafter, movable cutting member 71b slides relative to movable clamping member 72b while compressing urging spring 73 and comes into contact with lead portions 3R so that lead portions 3R are cut between movable cutting member 71b and fixed cutting member 71a.

At a time when lead portions 3R are cut, the initial posture (standing-upright posture) of body portion 3B of component 3 is maintained by posture maintainer 40 and a portion of each lead portion 3R that is close to body portion 3B is clamped by the pair of clamping members 72. Therefore, when lead portions 3R are sandwiched by the pair of cutting members 71, component 3 does not incline in a cutting direction (horizontal direction orthogonal to traveling direction of component holding tape HT in which tape travel mechanism 30 causes component holding tape HT to travel (X axis direction)) and the initial posture (standing-upright posture) of component 3 is maintained.

After component supply device 13 supplies component 3 to component supply position 13P and lead portions 3R are cut, installing head 22 causes suction nozzle 22a to descend such that the lower end thereof comes into contact with body portion 3B of component 3. Then, suction control mechanism 22b is operated such that a vacuum suction force is generated in the lower end of suction nozzle 22a. Furthermore, driving cylinder 81 is operated and moves plate cam 82 from the rear position to the front position (FIG. 12B->FIG. 12A). As a result, the pressing force that presses the lower end of swinging body 62 leftwards is removed and swinging body 62 swings around swinging shaft 61b and returns to the initial position (FIG. 10B->FIG. 10A, FIG. 12B->FIG. 12A). Accordingly, movable cutting member 71b is separated from fixed cutting member 71a and movable clamping member 72b is also separated from fixed clamping member 72a (FIG. 14D->FIG. 14C, FIG. 14B->FIG. 14A). Therefore, lead portions 3R clamped by the pair of clamping members 72 are released. When swinging body 62 returns to the initial position, swinging body 62 moves pressing roller 91R rightwards, and thus lever member 91 swings around roller supporting shaft 91a and returns to a position before cam follower 93 is pressed by driving cylinder 81 (FIG. 12B->FIG. 12A).

When lead portions 3R clamped by the pair of clamping members 72 are released, installing head 22 causes suction nozzle 22a having sucked component 3 to ascend and moves to a position above board 2. Then, installing head 22 installs component 3 onto a predetermined position on board 2 (component installation position) after moving to a position above component camera 14 such that component camera 14 images component 3. Component 3 is installed by inserting two lead portions 3R extending from component 3 into an insertion hole (not shown) provided on board 2. Control device 100 performs image recognition based on an image of component 3 captured by component camera 14 and controls the behavior of installing head 22 such that component 3 is installed on board 2 in proper posture.

When component 3 is installed on board 2 as described above, a clinching mechanism (not shown) clinches two lead portions 3R protruding downwards from board 2. After a clinching process performed by such a clinching mechanism is finished, board transport mechanism 12 transports board 2 to the outside of component mounter 1. In this manner, an operation of installing a component on one board 2, which is performed by component mounter 1, is finished.

As described above, in component mounter 1 according to the present embodiment, component supply device 13 includes posture maintainer 40 which includes the pair of grip members 43, each of which includes tip end portion 43a that extends from the upstream side to the downstream side in the traveling direction of the component holding tape HT, in which tape travel mechanism 30 causes component holding tape HT to travel (transportation direction of component 3). In addition, the posture of component 3 is maintained with body portion 3B of component 3, which is transported through component holding tape HT, being gripped by the pair of grip members 43 included by posture maintainer 40 (posture maintaining process). The initial posture (standing-upright posture) of component 3 is maintained even after the pair of cutting members 71 cuts lead portions 3R (cutting process). Therefore, it is possible for installing head 22 to reliably pick up component 3 and installation accuracy with respect to board 2 is improved. As a result, it is possible to increase the non-defective product rate of manufactured boards.

Although the embodiment has been described above, the present disclosure is not limited by the embodiment. For example, component supply device 13 in the present disclosure can also be applied to a component mounter that picks up component 3 by clamping component 3 using a chuck mechanism. Component mounter 1 in which installing head 22 sucks and picks up body portion 3B of component 3, which has been supplied to component supply position 13P by component supply device 13, through suction nozzle 22a as described in the embodiment may also be used. In this case, it is possible to position body portion 3B of component 3 to component supply position 13P with high accuracy, which results in an improvement in component installation accuracy and it is possible to achieve a greater effect.

According to the present disclosure, it is possible to provide a component supply device in which the initial posture of a component can be maintained even after a lead portion is cut and a component mounter including the same.

What is claimed is:

1. A component supply device which causes a component holding tape that holds a component provided with a body portion and a lead portion to travel such that the component is supplied to a component supply position, the device comprising:
    a posture maintainer that includes a pair of grip members, each of which includes a tip end portion that extends in a traveling direction of the component holding tape, and that maintains the posture of the component by gripping the body portion of the component having been supplied to the component supply position with the body portion interposed between the tip end portions of the pair of the grip members; and
    a pair of cutting members that cut the lead portion of the component having been gripped by the pair of grip members with the lead portion interposed between the pair of cutting members in a direction intersecting the traveling direction of the component holding tape.

2. The component supply device of claim 1,
wherein each of the pair of grip members is attached to a different one of a pair of columns that are provided so as to sandwitch the component holding tape from opposite lateral sides of the component holding tape traveling, and
wherein the gap between the tip end portions of the pair of grip members is changed by changing an attachment position of the pair of grip members with respect to the pair of columns.

3. The component supply device of claim 1,
wherein each of the pair of grip members is formed of a member that is elastically deformable in the direction intersecting the traveling direction of the component holding tape.

4. The component supply device of claim 1,
wherein each of the pair of grip members is attached to a different one of a pair of position adjustment members that are respectively attached to a pair of columns, and
wherein the position of the pair of grip members in a vertical direction is changed by changing an attachment position of the pair of position adjustment members with respect to the pair of columns.

5. The component supply device of claim 1, further comprising:
    a pair of clamping members that clamp a portion of the lead portion of the component having been gripped by the pair of grip members, the portion of the lead portion being positioned above a portion of the lead portion to be cut by the pair of cutting members.

6. The component supply device of claim 5,
wherein the pair of cutting members includes
    a fixed cutting member, and
    a movable cutting member that moves relative to the fixed cutting member,
wherein the pair of clamping member includes
    a fixed clamping member that is provided above the fixed cutting member, and
    a movable clamping member that is provided above the movable cutting member such that the movable clamping member is able to freely slide relative to the movable cutting member and that is connected to the movable cutting member via an elastic member,
wherein, when the movable cutting member approaches the fixed cutting member in a state where the lead portion is positioned between the pair of cutting members, the movable clamping member comes into contact with the lead portion such that the lead portion is clamped between the movable clamping member and the fixed clamping member before the movable cutting member comes into contact with the lead portion, and
wherein, after the lead portion is clamped, the movable cutting member slides relative to the movable clamping member while compressing the elastic member and comes into contact with the lead portion such that the lead portion is cut between the movable cutting member and the fixed cutting member.

7. A component mounter comprising:
the component supply device of claim 1;
a board transport mechanism that transports a board such that the board is positioned in a working position; and an installing head that sucks the body portion of the component that has been supplied to the component supply position by the component supply device to pick up the component and installs the component on the board that has been positioned in the working position.

8. The component mounter of claim 7, wherein the installing head sucks the body portion of the component that has been supplied to the component supply position by the component supply device to pick up the component.

9. A component-mounted board manufacturing method which is performed by using a component mounter, the component mounter including:

a component supply device that causes a component holding tape that holds a component provided with a body portion and a lead portion to travel such that the component is supplied to a component supply position;

a board transport mechanism that transports a board such that the board is positioned in a working position; and an installing head that sucks the body portion of the component that has been supplied to the component supply position by the component supply device to pick up the component and installs the component on the board that has been positioned in the working position, wherein the component supply device includes a pair of grip members, each of which includes a tip end portion that extends in a traveling direction of the component holding tape, the method comprising:

maintaining a posture of the component by gripping the body portion of the component having been supplied to the component supply position with the body portion interposed between the tip end portions of the pair of the grip members; and causing a pair of cutting members to cut the lead portion of the component having been gripped by the pair of grip members with the lead portion interposed between the pair of cutting members in a direction intersecting the traveling direction of the component holding tape.

10. The component-mounted board manufacturing method of claim 9, wherein each of the pair of grip members is attached to a different one of a pair of columns that are provided so as to sandwitch the component holding tape from opposite lateral sides of the component holding tape traveling, and the component-mounted board manufacturing method further comprises changing the gap between the tip end portions of the pair of grip members by changing an attachment position of the pair of grip members with respect to the pair of columns.

11. The component-mounted board manufacturing method of claim 9, wherein the maintaining of the posture includes causing the pair of grip members to elastically grip the body portion of the component in the direction intersecting the traveling direction of the component holding tape.

12. The component-mounted board manufacturing method of claim 9, wherein each of the pair of grip members is attached to a different one of a pair of position adjustment members that are respectively attached to a pair of columns, and wherein component-mounted board manufacturing method further comprises changing a position of the pair of grip members in a vertical direction by changing an attachment position of the pair of position adjustment members with respect to the pair of columns.

* * * * *